United States Patent
Yano (10) Patent No.: US 9,224,481 B2
(45) Date of Patent: Dec. 29, 2015

(54) SEMICONDUCTOR STORAGE DEVICE

(71) Applicant: Winbond Electronics Corp., Taichung (TW)

(72) Inventor: Masaru Yano, Tokyo (JP)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 14/447,051

(22) Filed: Jul. 30, 2014

(65) Prior Publication Data

US 2015/0155045 A1  Jun. 4, 2015

(30) Foreign Application Priority Data

Dec. 3, 2013   (JP) ................................ 2013-250219

(51) Int. Cl.
| | | |
|---|---|---|
| G11C 11/34 | (2006.01) | |
| G11C 16/10 | (2006.01) | |
| G11C 16/34 | (2006.01) | |
| G11C 16/04 | (2006.01) | |
| G11C 11/56 | (2006.01) | |

(52) U.S. Cl.
CPC ............ *G11C 16/10* (2013.01); *G11C 11/5628* (2013.01); *G11C 16/0483* (2013.01); *G11C 16/3459* (2013.01)

(58) Field of Classification Search
USPC ............ 365/185.12, 185, 17, 185.18, 185.19, 365/185.22, 185.24, 185.33
See application file for complete search history.

(56) References Cited

U.S. PATENT DOCUMENTS

| | | | | |
|---|---|---|---|---|
| 5,493,526 | A * | 2/1996 | Turner et al. | 365/185.33 |
| 5,892,711 | A * | 4/1999 | Park | 365/185.33 |
| 6,874,069 | B2 * | 3/2005 | Lin et al. | 365/185.33 |
| 7,286,398 | B2 * | 10/2007 | Yano et al. | 365/185.17 |
| 7,325,114 | B2 * | 1/2008 | DeCaro | 365/185.33 |
| 7,405,968 | B2 | 7/2008 | Mokhlesi et al. | |
| 7,755,945 | B2 * | 7/2010 | Ho et al. | 365/185.18 |
| 7,805,562 | B2 * | 9/2010 | Yada et al. | 365/185.33 |

FOREIGN PATENT DOCUMENTS

| | | |
|---|---|---|
| JP | 3626221 | 7/1995 |
| JP | WO 2007/079062 A1 | 7/2007 |
| JP | 2010-211883 | 9/2010 |
| JP | 2013/122799 | 6/2013 |

OTHER PUBLICATIONS

TW Office Action dated Aug. 21, 2015 from corresponding TW Appl No. 10421113880, 7 pp.

* cited by examiner

*Primary Examiner* — Trong Phan
(74) *Attorney, Agent, or Firm* — Muncy, Geissler, Olds & Lowe, P.C.

(57) ABSTRACT

A semiconductor storage device restraining the variation in threshold voltage of a memory unit is provided. The steps of the programming method for a flash memory include: setting a bit line to a program voltage or a program-protection voltage; applying a program pulse to the selected page; and verifying the programming of the selected page. Also, the steps further include: when the verification result indicates that there is a failed-shift memory cell which was passed previously but is failed presently, setting the voltage of the bit line of the failed shift memory to a mitigation voltage for mitigating the voltage of the next program pulse.

8 Claims, 8 Drawing Sheets

| | Erase | Write | Read |
|---|---|---|---|
| Selected word line | 0 | 15V~20V | 0 |
| Unselected word line | Floating state | 10V | 4.5 |
| SGD | Floating state | Vcc | 4.5 |
| SGS | Floating state | 0 | 4.5 |
| SL | Floating state | Vcc | 0 |
| P well | 20 | 0 | 0 |

SEMICONDUCTOR STORAGE DEVICE

CROSS REFERENCE TO RELATED APPLICATIONS

This application claims priority of Japan Patent Application No. 2013-250219, filed on Dec. 3, 2013, the entirety of which is incorporated by reference herein.

BACKGROUND OF THE INVENTION

1. Field of the Invention

The invention is related to a semiconductor storage device, and more particularly to programming (writing) a NAND-type flash memory.

2. Description of the Related Art

As a storage device, flash memory is widely used in electronic devices such as digital cameras and smart phones. In the market for flash memory, small size and large capacity are required, and high speed, and low power consumption are also required. Furthermore, consumers demand that flash memory have a certain number of data-rewritable times and data-retention characteristics.

Figure 1:
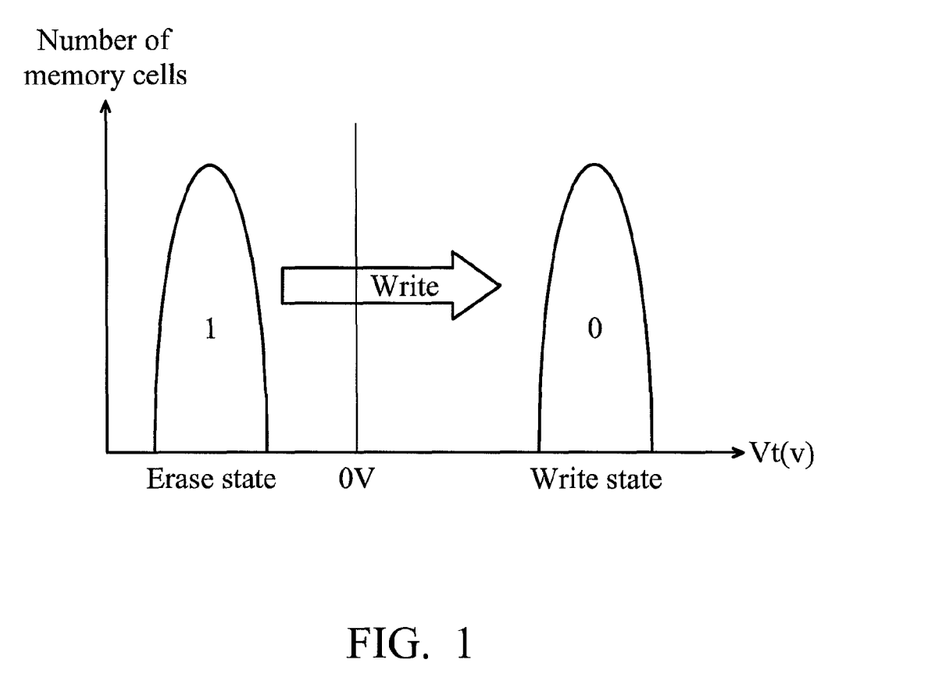
FIG. 1 shows the threshold voltage of the flash memory in the erase state and the write state.

A typical flash memory is formed by memory cells each with an N-type MOS structure. When electrons accumulate in the charge accumulation layer of the memory cell, the threshold voltage of the memory cell is shifted toward the positive direction, for example, the state is "0". On the other hand, when electrons are released from the charge accumulation layer, the threshold voltage is shifted toward the negative direction, for example, the state is "1". FIG. 1 shows the threshold voltage of the flash memory in the erase state and the write state, which shows the distribution width of the threshold voltage of the memory cell for "0" and "1", and the threshold voltage of the memory cell is written under control within the distribution width.

Because there are variable factors such as variations in manufacturing process parameters and variations in time, the charge accumulation layer and the tunnel oxide film of each memory cell is not always uniform. In other words, electrons are easily injected into some memory cells, while they are injected into other memory cells with difficulty. When the same write voltage is applied to both memory cells, the shift amounts (variation) of the threshold voltage of the two memory cells are relatively different. Therefore, for example, when performing a page write, the accumulated electrons in some memory cells are sufficient to meet the distribution width of the threshold voltage for "0", but the accumulated electrons in other memory cells are insufficient to meet the distribution width of the threshold voltage for "0". Usually, by using program verification, a write voltage can again be applied to the memory cell with an insufficient injection of electrons, in order to meet the distribution width of the threshold voltage for "0".

Figure 2A:
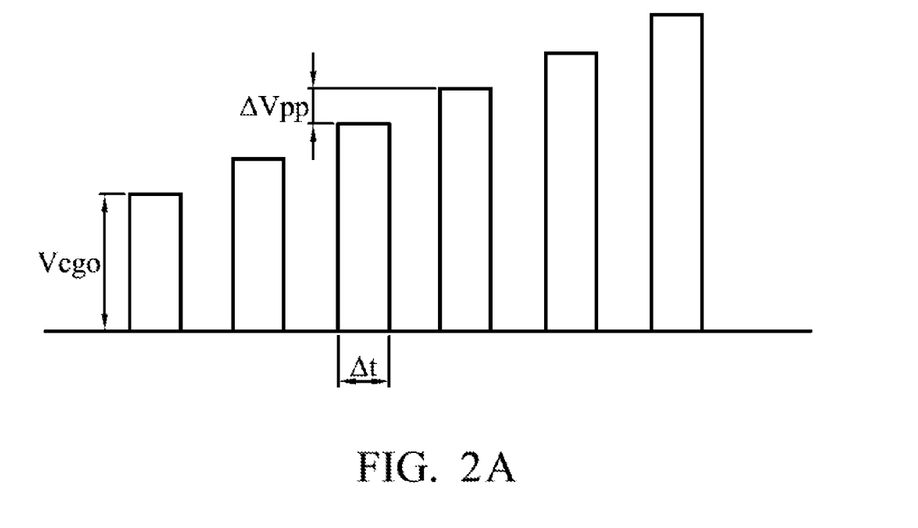
FIGS. 2A and 2B are schematic diagrams illustrating memory cells of a conventional flash memory with write pulses applied.
Figure 2B:
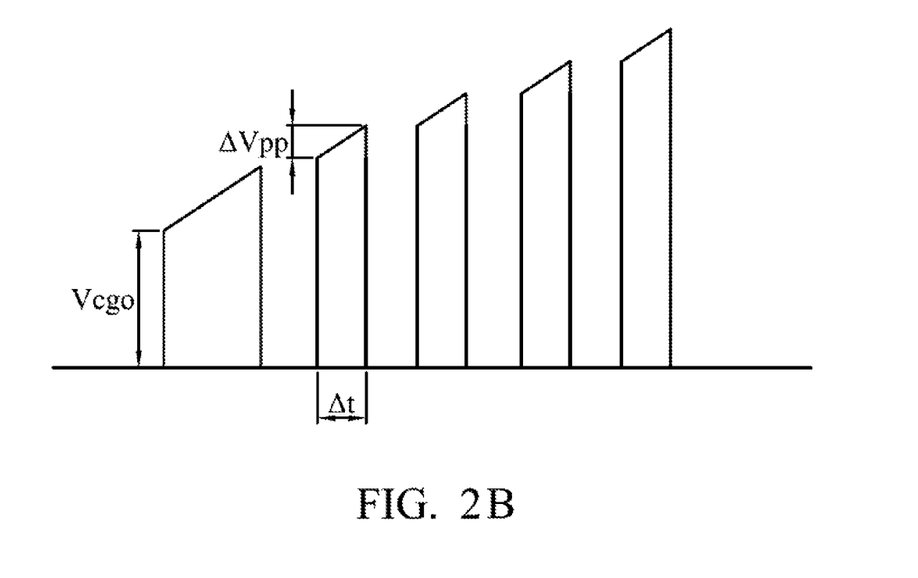

Japan Patent No. 3626221 discloses a flash memory which can narrow the distribution width of the threshold voltage of the memory cell, and can perform electron injection at high speed. In the flash memory, the write voltage is divided into a plurality of pulses, and applied to the gate of the memory cell. As shown in FIG. 2A, the Vpp pulse voltage first applied to the control gate is Vcgo, the write pulse is gradually increased by $\Delta$Vpp. The pulse width is a predetermined time $\Delta$t, and the maximum variation amount $\Delta$Vth of the threshold voltage of the memory cell in one operation for the electron injection is equal to $\Delta$Vpp. In addition, the write pulse as shown in FIG. 2B, each Vpp pulse has a fixed dVpp/dt, and merely raises $\Delta$Vpp continuously. Therefore, the floating gate potential can be substantially constant during the electron injection, and the degradation of the tunnel oxide film can be minimized.

BRIEF SUMMARY OF THE INVENTION

Figure 3A:
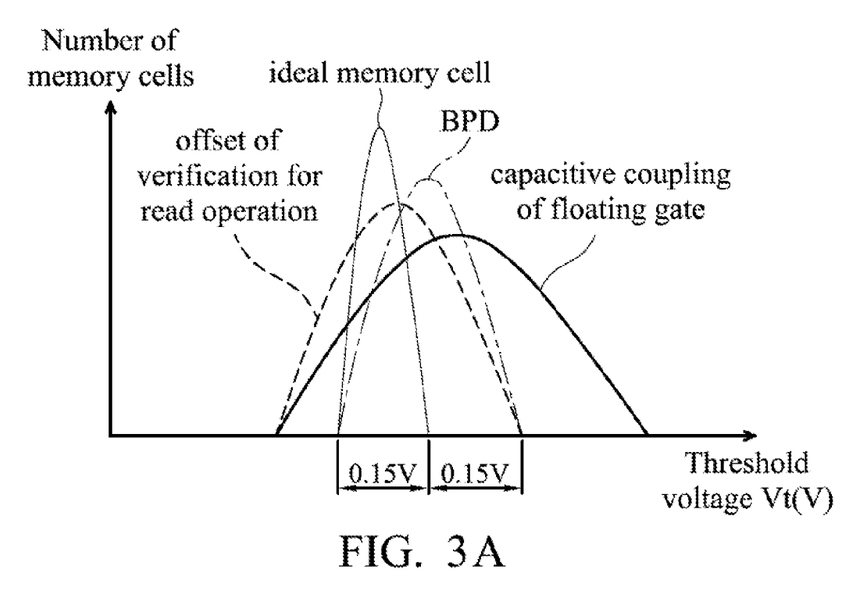
FIG. 3A is a schematic diagram illustrating the factors of the variation in the threshold voltage of the memory cell.

In the flash memory, after programming of the pages in the block is completed, there are several factors causing the variation in the distribution width of the threshold voltage of the memory cell. The main factors for varying the threshold voltage comprise background pattern dependency (BPD), capacitive coupling of the floating gate, and the offset of the verification for read operation. FIG. 3A is a schematic diagram illustrating the factors of the variation in the threshold voltage of the memory cell, which illustrates an embodiment of the variation in the threshold voltage of the memory cell by this parasitic influence. In an ideal memory cell, the distribution width of the threshold voltage after program is within the range of 0.15V, but the distribution widths of the threshold voltage of the offset of the verification for read operation, the background pattern dependency and capacitive coupling of the floating gate (FG coupling) are relatively wide.

Figure 3B:
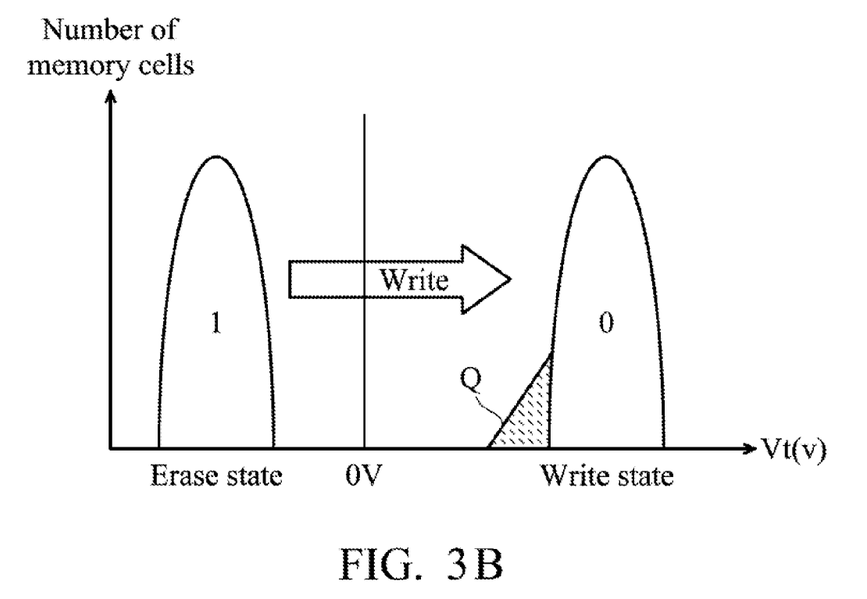
FIG. 3B is a schematic diagram for explaining a problem of programming in the conventional flash memory.

In addition, along with the circuit line width being miniaturized, the variation in the threshold voltage of the transistor caused by Random Telegraph Noise (RTN) can be known. Furthermore, by verifying the page program, the current of the erased memory cell is reduced, which means that the bounce of the source is reduced, and the threshold voltage of this memory cell can be therefore varied. Under the second effect (floating/bounce of the source) of the source and Random Telegraph Noise, a bit which should not be a "pass" by the program verification is represented as a "pass". FIG. 3B is a schematic diagram for explaining a problem of programming in the conventional flash memory. When the programming is completed, as shown in FIG. 3B, the threshold voltage of this bit is distributed in the region Q so that the threshold voltage can't be in the distribution width.

In order to solve the problems of the prior art, an embodiment of the present invention provides a semiconductor memory device for suppressing the variation of the threshold voltage of the memory cell.

An embodiment of the present invention provides a flash memory having a memory array formed by a plurality of NAND-type memory cells. The flash memory includes a selection unit, a setting unit, an application unit, a verification unit, and determination unit. The selection unit selects a page of the memory array. The setting unit sets a bit-line voltage for programming or program-protection of a bit line. In other words, the setting unit sets the bit-line voltage to an appropriate level for either programming or program-protection of the bit line. The application unit applies a program pulse to the selected page. The verification unit verifies the qualification of the program. The determination unit identifies a failed-shift memory cell which was passed previously but is failed presently according to the verification result. When a failed shift memory is identified, the setting unit sets the bit-line voltage of the failed-shift memory cell to a mitigation voltage for mitigating the voltage of the next program pulse.

In a preferred embodiment, the mitigation voltage is a step voltage between two program pulses. In a preferred embodiment, the mitigation voltage is between the voltage for programming and the voltage for program-protection. In a preferred embodiment, the determination unit identifies the failed-shift memory by the verification results before and after application of the program pulse. In a preferred embodiment, the determination unit has a storage unit configured to store the verification results generated by comparing the verification unit, and the verification results are stored for identifying the failed-shift memory cell.

An embodiment of the present invention provides a programming method for a flash memory having a memory array formed by a plurality of NAND-type memory cells. The programming method includes: setting a bit line to a program voltage or a program-protection voltage according to program data; applying a program pulse to a selected page; verifying the programming of the selected page; and when the verification result indicates there is a failed-shift memory which was passed previously but is failed presently, setting the voltage of the bit line of the failed-shift memory to a mitigation voltage for mitigating the voltage of the next program pulse.

In a preferred embodiment, the mitigation voltage is a step voltage between two program pulses. In a preferred embodiment, the programming method further includes: identifying the failed-shift memory by comparing the verification results before and after application of the program pulse.

According to the present invention, it can reduce the influence of variations in threshold voltage of the memory cell caused by the bounce of the source and Random Telegraph Noise.

DETAILED DESCRIPTION OF THE INVENTION

The embodiment of the invention will become more fully understood by referring to the following detailed description with reference to the accompanying drawings. A preferred embodiment of the present invention uses a NAND-type flash memory as an example. Also, for easier identification, some portion shown in the drawings may be emphasized. Therefore, it should be noted that the scale of the drawings may not be the same as the actual device.

Figure 4:
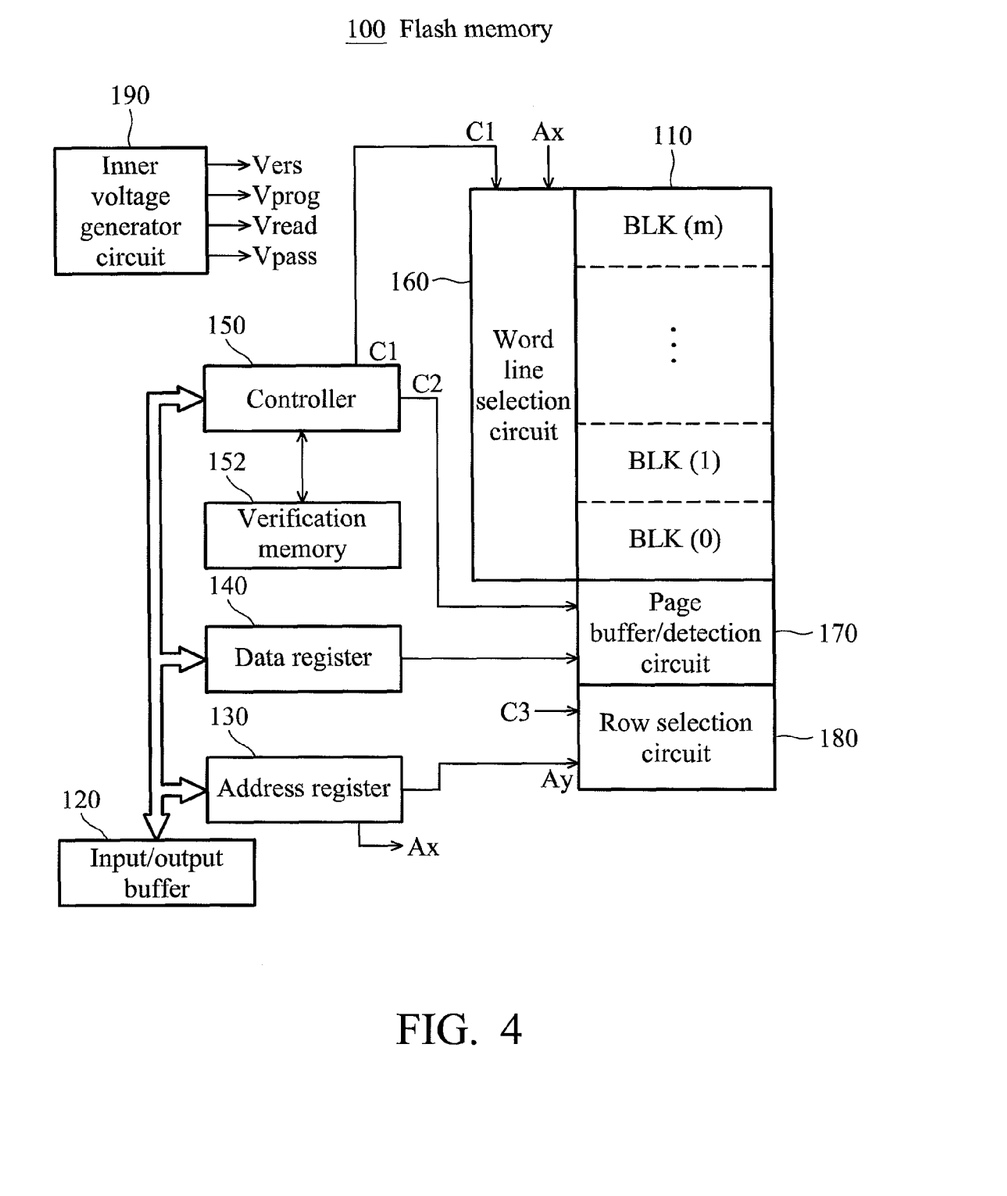
FIG. 4 is a block diagram illustrating a configuration of a flash memory according to an embodiment of the present invention.

FIG. 4 is a block diagram illustrating a configuration of a flash memory according to an embodiment of the present invention. However, the configuration of the flash memory shown is only an example, and the present invention is not limited thereto.

The flash memory 100 of the embodiment includes a memory array 110 having memory cells arranged in columns and rows, an input/output buffer 120 buffering input/output data connected to an external input/output terminal I/O, an address register 130 receiving address data from the input/output buffer 120, a data register 140 temporarily storing input/output data, a controller 150 receiving instruction data from the input/output buffer 120, and controlling each unit by providing control signals C1, C2 and C3 according to an external control signal (chip-enable signal, or address-latch enable signal and so on, not shown in the diagram), a verification memory 152 storing the verification result of program, a word line selection circuit 160 selecting the block and a word line according to the decoding result of column address information Ax from the address register 130, a page buffer/detection circuit 170 temporarily storing data read from the page selected by the word line selection circuit 160 and temporarily storing data which will be written to the selected page, a row selection circuit 180 selecting the bit line according to the decoding result of row address information Ay from the address register 130, and an inner voltage generator circuit 190 generating necessary voltages for reading, programming and erasing (programming voltage Vprog, passing voltage Vpass, reading voltage Vread, erasing voltage Vers, etc.).

In an embodiment of the invention, a memory array 110 has a plurality of blocks BLK(L)0, BLK(L)2, ..., BLK(L)m−1 arranged in a row, and the page buffer/detection circuit 170 is arranged at one terminal of the blocks. However, the page buffer/detection circuit 170 can be arranged at the other terminal, or at both terminals of the blocks.

Figure 5:
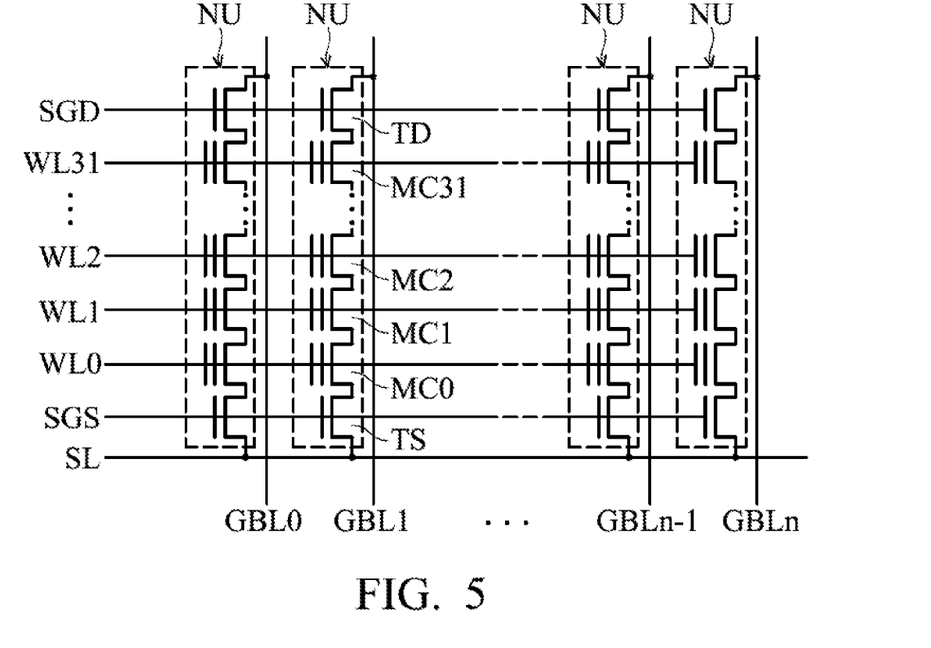
FIG. 5 is a circuit diagram illustrating a configuration of NAND strings of a memory array according to an embodiment of the present invention.

In a memory block, as shown in FIG. 5, a plurality of NAND cell units are formed, a NAND string cell unit NU is formed by a plurality of memory cells connected in series, and there are n+1 string cell units NU arranged in a column. Each string cell unit NU respectively connects to the corresponding bit line GBL0~GBLn. Each of the cell units NU includes a plurality of memory cells MCi (i=0, 1, ..., 31) connected in series, one terminal is connected to a selection transistor TD on the drain side of the memory cell MC31, and the other terminal is connected to a selection transistor TS on the source side of the memory cell MC0. The drain of the selection transistor TD is connected to the corresponding bit line GBL, and the source of the selection transistor TS is connected to a common source line SL.

The control gate of each memory cell MCi is coupled to the corresponding word line WLi, and the gates of the selection transistor TD and TS are respectively coupled to the selection gate lines SGD and SGS parallel to the word line WL. When the word line selection circuit 160 selects a block according to the column address information Ax, and the selection transistors TD and TS are selectively driven by the selection gate line signals SGS and SGD. In addition, FIG. 5 illustrates a typical configuration of the cell unit, but the cell unit can further have a dummy cell.

A typical memory cell has a MOS structure including a source/drain formed by the N-type diffusion areas in a P-type well, a tunnel oxide film formed on the channel between the source and the drain, a floating gate (charge accumulation layer) formed on the tunnel oxide film, and a control gate formed by a dielectric film on the floating gate. When there is no charge accumulating in the floating gate, namely the write data is "1", the threshold voltage is a minus value, and the memory cells are turned on. When there are charges accumulating in the floating gate, namely the write data is "0", the threshold voltage is a positive value, and the memory cells are turned off.

Figure 6:
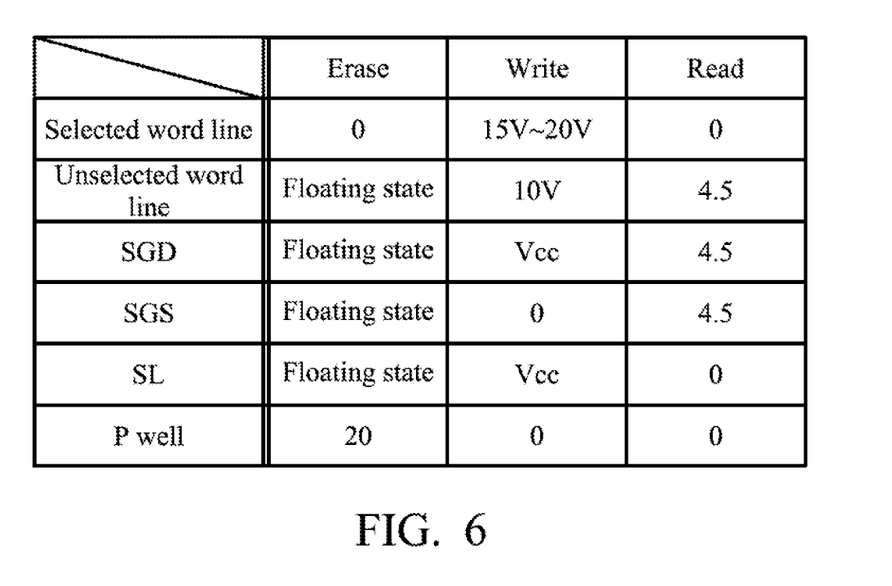
FIG. 6 is a schematic diagram showing the voltages applied to each unit of a flash memory according to an embodiment of the present invention.

FIG. 6 is a table showing the bias voltages applied in each of operations for an embodiment of a flash memory. During the read operation, a predetermined positive voltage is applied to the bit line, a predetermined voltage (ex. 0V) is applied to the selected word line, and a pass voltage (ex. 4.5V) is applied to the unselected word lines. A positive voltage (ex. 4.5V) is applied to the selection gate lines SGD and SGS so that the bit line selection transistor TD and the source line selection transistor TS are turned on. Also, 0V is applied to the common source line. During the program (write) operation, a high-voltage programming voltage Vprog (15-20V) is applied to the selected word line, and a middle voltage (ex. 10V) is applied to the unselected word line so that the bit line selection transistor TD is turned on, and the source line selection transistor TS is turned off. Also, the potential corresponding to data "0" or "1" is applied to the bit line GBL. During the erase operation, 0V is applied to the selected word line inside the block, a high voltage (ex. 20V) is applied to the P-type well, and data is erased in the unit of block by pulling out the electrons in the floating gate from the substrate.

Next, the program operation of the flash memory according to an embodiment of the present invention is described. The input/output buffer 120 receives a command, program data and address from the external controller, and the external control signal is received via an input terminal. The controller 150 decodes the received command to perform the program, and control the write operation. The page buffer/detection circuit 170 temporarily stores the received program data by the data register 140, and the word line selection circuit 160 selects a page according to the received address.

The word line selection circuit 160 applies a program pulse to the selected page according to the column address information Ax. The program pulse Vprog is generated by the inner voltage generator circuit 190 as shown in FIG. 4, and the program pulse progressively increases with the step voltages as shown in FIGS. 2A and 2B corresponding to the verification result. A program pulse Vprog in the range of about 15-20V is applied to the selected page, and a pass voltage Vpass 10V is applied to the unselected page. Vcc is applied to the selection gate line SGD, and 0V is applied to the selection gate line SGS. Further, 0V is applied to the bit line for programming to form "0", and Vcc or Vdd is applied to the bit line for program-protection to form "1".

Figure 7:
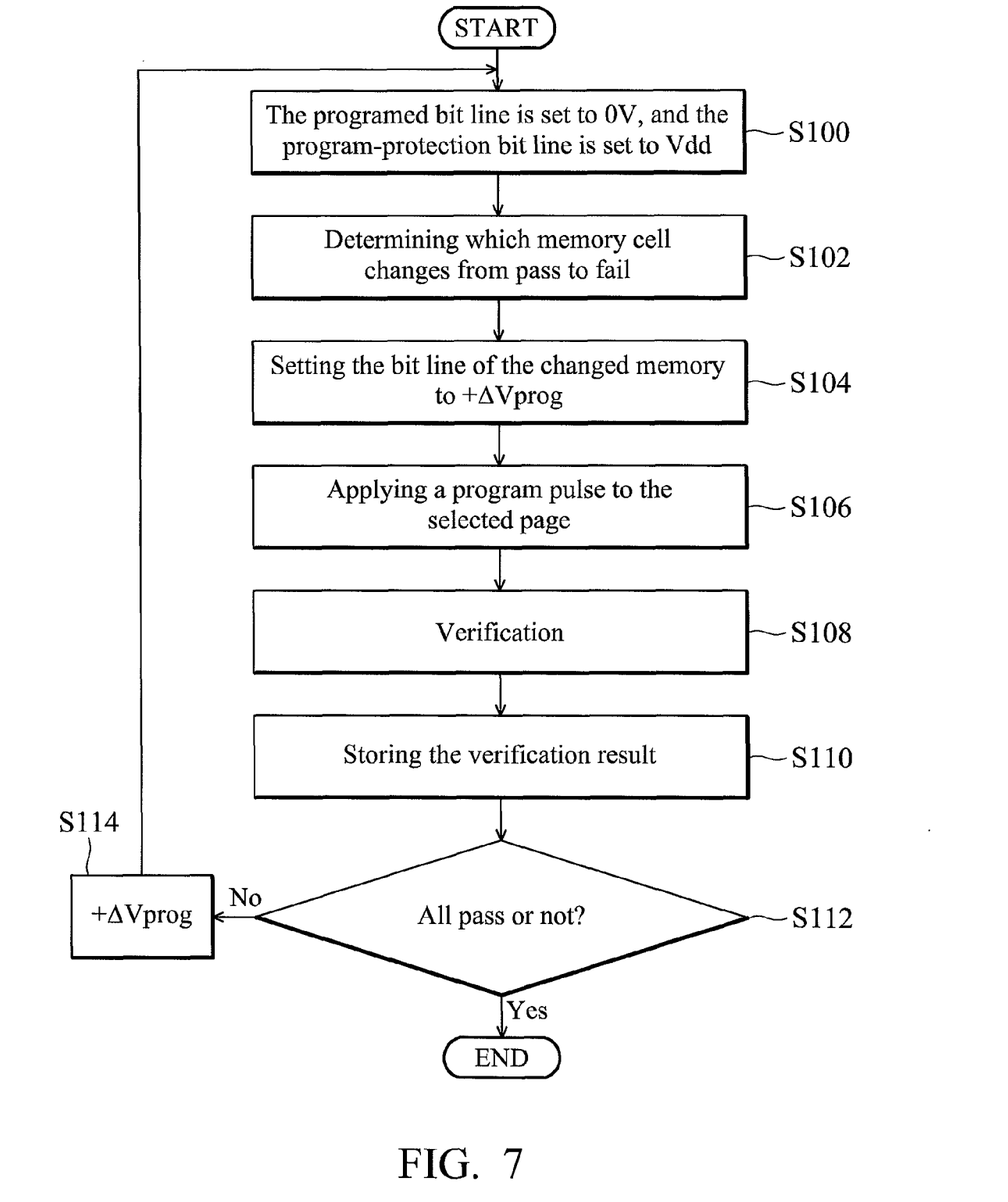
FIG. 7 is a flowchart of the program operation according to an embodiment of the present invention.

FIG. 7 is a flowchart of an embodiment of the program operation according to the present invention. As described above, the buffer/detection circuit 170 sets the bit line BL of the programmed memory cell to 0V, and sets the bit line BL of the program protected memory cell to Vdd according to the program data (S100).

Next, according to the verification result of the page program, the controller 150 identifies which memory cell is failed (Fail) after the page program, but it previously was passed (Pass) (hereinafter referred to as a "failed-shift memory cell") (S102). The verification result after the application of a program pulse is stored in the verification memory 152, in order to compare with the verification result after the next application of a program pulse. This means that it determines whether the failed-shift memory exists by comparing the verification results before and after application of the program pulse. Therefore, the determination is actually obtained from two verifications after each application of two program pulses.

Next, when a failed-shift memory cell is detected, the bit line BL of the failed-shift memory cell is set to +ΔVprog for mitigating, such as gradually adjusting, the program voltage of the next program pulse (S104). In the identification of the failed-shift memory cell, since the verification for the second application of a program pulse corrects the program voltage to the failed-shift memory cell. The third and subsequent application of the program pulses are actually the subject.

Next, the word line selection circuit 160 applies the program pulse to the selected page (S106), and performs programming for the selected page. Next, the verification for the qualification of the programming is performed (S108). In other words, the verification is to determine whether the threshold voltages of the memory cells in the selected page are within the distribution width of "0". In the verification, a verification voltage (or read voltage) is applied to the selected page, and a potential or current of the bit line is detected by the buffer/detection circuit 170. According to the verification result, if the selected memory cell can be turned on, the programming of the selected memory cell is not qualified (Fail). If the selected memory cell cannot be turned on, the programming of the selected memory cell is qualified (Pass). The controller 150 stores the verification result into the verification memory 152 (S110).

The controller 150 determines whether all of the memory cells in the selected page have passed according to the verification result of the selected page (S112). When all of the memory cells in the selected page have passed, the programming of the selected page is completed.

When a part of the memory cells in the selected page have not passed, a step voltage ΔVprog is added to the previous program pulse for generating a new program pulse (S114), and the new program pulse is applied to the selected page. Simultaneously, the bit lines of the passed memory cells are set to Vdd for program-protection, and the bit lines of the failed memory cells are set to 0V.

Steps S100 to S114 as described above are repeated. After the second and subsequent program pulses are applied, the controller 150 compares the verification results stored in the verification memory 152 for identifying which memory cell has failed in the present verification but was passed in the previous verification (S102). In this event described above, the ultra-miniaturization of the memory cell accompanies Random Telegraph Noise, and Random Telegraph Noise causes the rapid variation of the threshold voltage. Also, the bounce of source causes variation of the threshold voltage. As shown in FIG. 3B, the threshold voltage would be distributed in the region Q so that the threshold voltage can't reach the width of the distribution of "0".

If a failed-shift memory cell is found, under the control of the controller 150, the bit line (BL) of the failed-shift memory cell is set to a re-programmable voltage. Normally, the re-programmable voltage is not equal to but higher than the program voltage (0V). In a preferable embodiment, the re-programmable voltage is equal to the program pulse plus the step voltage ΔVprog, because there is a risk of over-program. That is, the program voltage of the failed-shift memory cell will be too strong when the bit line BL is set to 0V and the failed-shift memory cell is applied a voltage only 2×ΔVprog higher than the program pulse applied to the passed memory cell. Therefore, ΔVprog is applied to the bit line BL in order to mitigate the voltage of 2×ΔVprog. In addition, the voltage set to the bit line BL of the failed-shift memory cell is not limited to ΔVprog, and it can be set to a voltage higher than the program voltage (0V) but lower than the program-protection voltage (Vdd). In a preferable embodiment, setting the voltage for the bit line BL of the failed-shift memory cell is performed by the buffer/detection circuit 170. Also, if the bit line of the failed-shift memory cell is set to ΔVprog, the buffer/detection circuit 170 may also provide ΔVprog generated by the inner voltage generator circuit 190 to the bit line.

Figure 8:
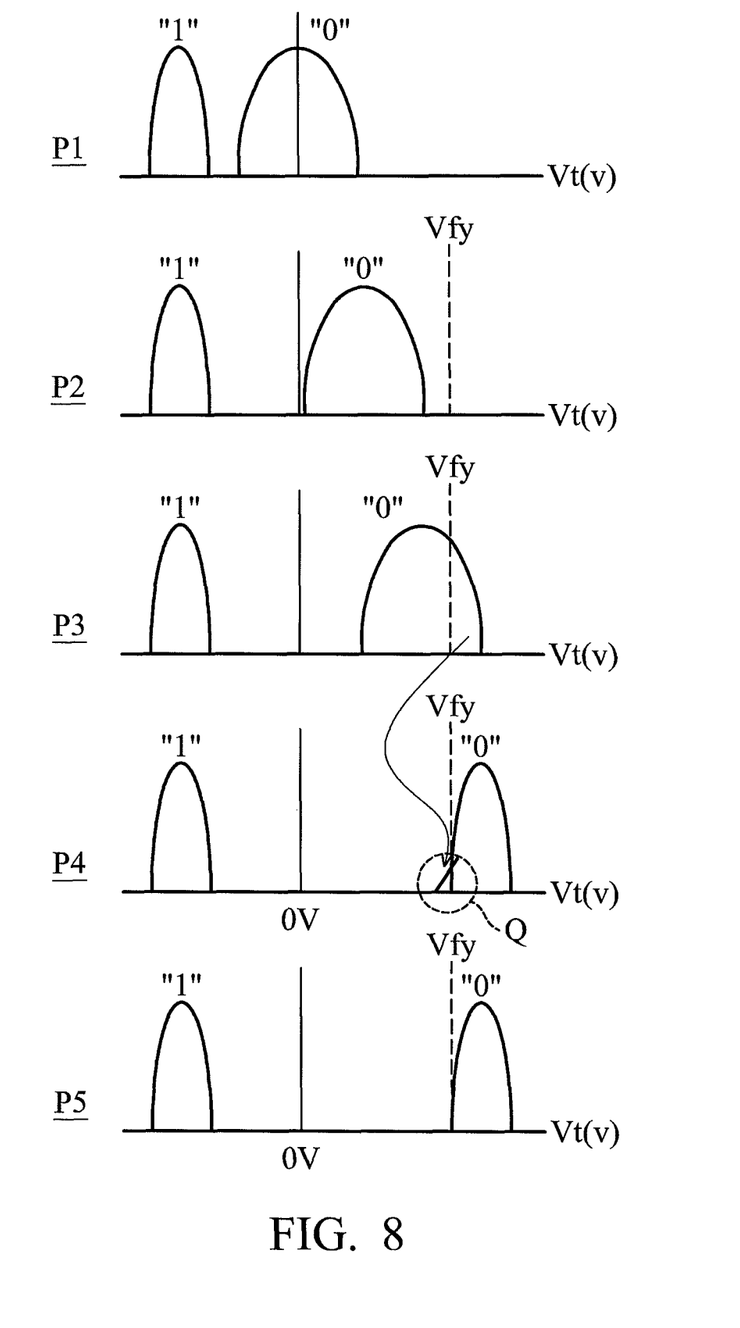
FIG. 8 is a schematic diagram showing the shift of threshold voltages when program pulses are applied.

FIG. 8 illustrates the distribution width of the threshold voltage (data "0") when the program pulses P1, P2, P3, P4 and P5 are applied to the programmed memory cell. By applying the program pulse P2, there is no memory cell has a shifted threshold voltage Vt higher than the verification voltage Vfy, namely, there is no memory cell that passes the verification. However, when the program pulse P3 is applied, some of the memory cells have a threshold voltage Vt higher than the verification voltage Vfy, and are identified as a pass. In the verification after the application of the program pulse P4, some of the memory cells previously identified as a pass are distributed in a region Q which is lower than the minimum of the distribution width, and are identified as a fail. In other words, these are the failed-shift memory cells. Next, when the program pulse P5 is applied, mitigation of the program for the failed-shift memory cells in the region Q is performed, and the threshold voltage of the failed-shift memory cells are shifted into the distribution width of the data "0".

Figure 9:
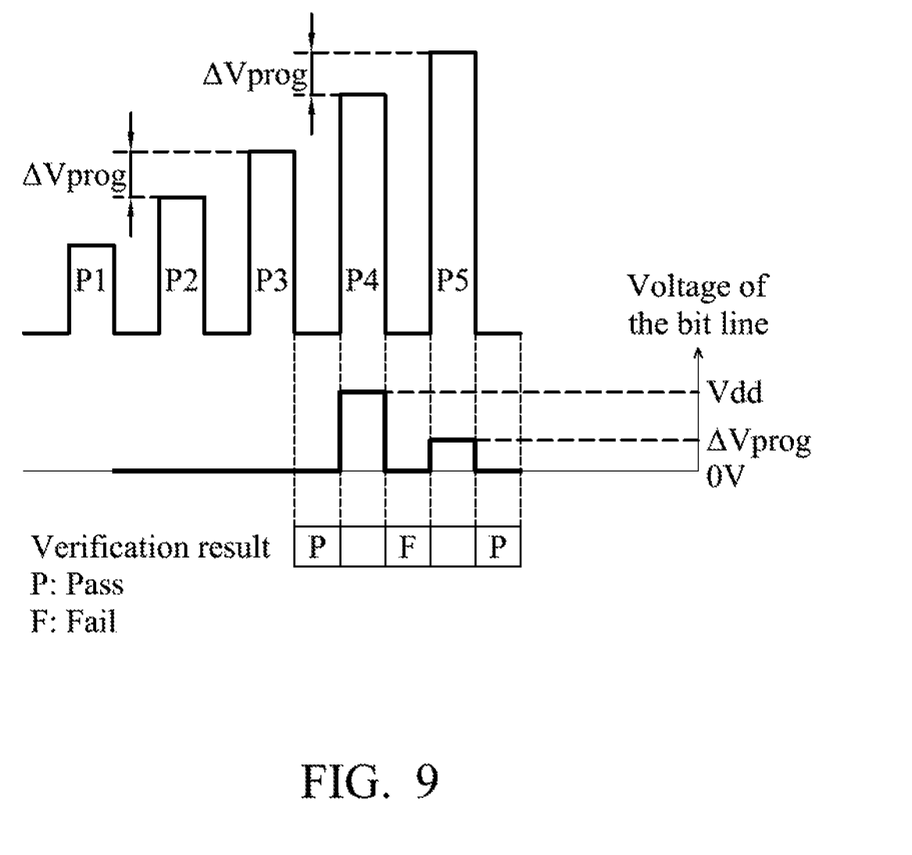
FIG. 9 is a schematic diagram showing the relationship between the voltages of the bit line and the verification results when program pulses are applied.

FIG. 9 corresponds to FIG. 8, and shows the relationship between the voltage of the bit line and the verification results when program pulses P1, P2, P3, P4 and P5 are applied. The step voltage of the program pulse is ΔVprog, and the ΔVth is shifted in response to ΔVprog in an ideal memory cell.

For the memory cells which are identified as a pass after the application of the program pulse P3, the voltage of the bit line is set to Vcc or Vdd for the program protection. Next, the program pulse P4 is applied. In the verification after the application of the program pulse P4, if a memory cell was passed in the previous verification but is identified as fail in the verification, the program pulse P5 is applied to the failed-shift memory cell. The program pulse P5 is 2×ΔVprog higher than the program pulse P3, and the expected shift is 2×ΔVth, but it may be over-programmed. Therefore, the voltage of the bit line is set to ΔVprog from 0V. Accordingly, the channel potential the of failed-shift memory cell is raised to ΔVprog from 0V, and the difference between the channel potential and the voltage of the program pulse P5 is reduced to ΔVprog. Accordingly, the variations in threshold voltage caused by RTN or the bounce of source can be corrected, and the threshold voltage can be within the desired distribution width.

The above embodiment uses one memory cell storing binary data, for example, but it can be applied to a flash memory with the memory cell storing multi-value data. Furthermore, those skilled in the art can make the generation of program pulses by using a well-known circuit technique. Also, the number of program pulses, pulse voltage and the pulse width time can be suitably set according to the design specifications of the flash memory.

While the invention has been described by way of example and in terms of preferred embodiment, it is to be understood that the invention is not limited thereto. Therefore, the scope of the present invention shall be defined and protected by the following claims and their equivalents.

What is claimed is:

1. A flash memory, comprising a memory array formed by a plurality of NAND-type memory cells, comprising:
    a selection unit, selecting a page of the memory array;
    a setting unit, setting a bit-line voltage for programming or program-protection of a bit line;
    an application unit, applying a program pulse to a selected page;
    a verification unit, verifying a qualification of a program; and
    a determination unit, identifying a failed-shift memory cell which was passed previously but is failed presently according to a verification result;
    wherein when there is the failed shift memory, the setting unit sets the bit-line voltage of the failed-shift memory cell to a mitigation voltage for mitigating the voltage of a next program pulse.

2. The flash memory of claim 1, wherein the mitigation voltage is a step voltage between two program pulses.

3. The flash memory of claim 1, wherein the mitigation voltage is between a voltage for programming and a voltage for program-protection.

4. The flash memory of claim 1, wherein the determination unit identifies the failed-shift memory by comparing the verification results before and after application of the program pulse.

5. The flash memory of claim 1, wherein the determination unit has a storage unit configured to store the verification results generated by the verification unit, and the verification results are stored for identifying the failed-shift memory cell.

6. A programming method for a flash memory comprising a memory array formed by a plurality of NAND-type memory cells, comprising:
    setting a bit line to a program voltage or a program-protection voltage according to program data;
    applying a program pulse to a selected page;
    verifying the programming of the selected page; and
    when a verification result indicates that there is a failed-shift memory cell which was passed previously but is failed presently, setting the bit line of the failed-shift memory to a mitigation voltage for mitigating the voltage of a next program pulse.

7. The programming method of claim 6, wherein the mitigation voltage is a step voltage between two program pulses.

8. The programming method of claim 6, further comprising: identifying the failed-shift memory by comparing the verification results before and after application of the program pulse.

* * * * *